United States Patent [19]
Proebsting

[11] Patent Number: 5,952,948
[45] Date of Patent: Sep. 14, 1999

[54] LOW POWER LIQUID-CRYSTAL DISPLAY DRIVER

[75] Inventor: Robert J. Proebsting, Los Altos Hills, Calif.

[73] Assignee: Townsend and Townsend and Crew LLP

[21] Appl. No.: 08/936,335

[22] Filed: Sep. 24, 1997

[51] Int. Cl.$^6$ .................................................. H03M 1/66
[52] U.S. Cl. .......................................................... 341/144
[58] Field of Search .................................. 341/136, 144, 341/145, 172, 150, 154

[56] References Cited

U.S. PATENT DOCUMENTS

| | | | |
|---|---|---|---|
| 4,918,448 | 4/1990 | Hauviller et al. | 341/145 |
| 4,973,979 | 11/1990 | Ikeda | 341/154 |
| 5,065,159 | 11/1991 | Kuwana | 341/148 |
| 5,079,552 | 1/1992 | Pelgrom et al. | 341/148 |
| 5,198,747 | 3/1993 | Haight | 323/303 |
| 5,252,975 | 10/1993 | Yuasa et al. | 341/145 |
| 5,386,438 | 1/1995 | England | 375/121 |

OTHER PUBLICATIONS

"A 25MHz 162–Output S/H Analog Column Driver for LCDs," Lelah et al., *Digest of Technical Papers,* IEEE International Solid–State Circut Conference, 1992.

"A 30–V Row/Column Driver for Flat–Panel Liquid Crystal Displays," Mühlemann, Jul. 29, 1987, rev. Nov. 11, 1987, *IEEE Journal of Solid State Circuits,* vol. 23, No. 2, Apr. 1988.

*Primary Examiner*—Brian Young
*Assistant Examiner*—Peguy Jean Pierre
*Attorney, Agent, or Firm*—Townsend and Townsend and Crew LLP

[57] ABSTRACT

A low power digital to analog converter (DAC) circuit is presented that is particularly suited for liquid-crystal display driver systems. The DAC according to one embodiment of the present invention uses a dedicated resistive divider chain that is selectively switched between adjacent pairs of coarse analog reference signals to generate finer analog reference signals. In a preferred embodiment, the resistance of the switches are used in combination with the resistive divider chain to form a voltage divider. In the preferred embodiment, the DAC of the present invention uses MOS transistors to implement the switches and the resistive elements in the divider chain.

21 Claims, 6 Drawing Sheets

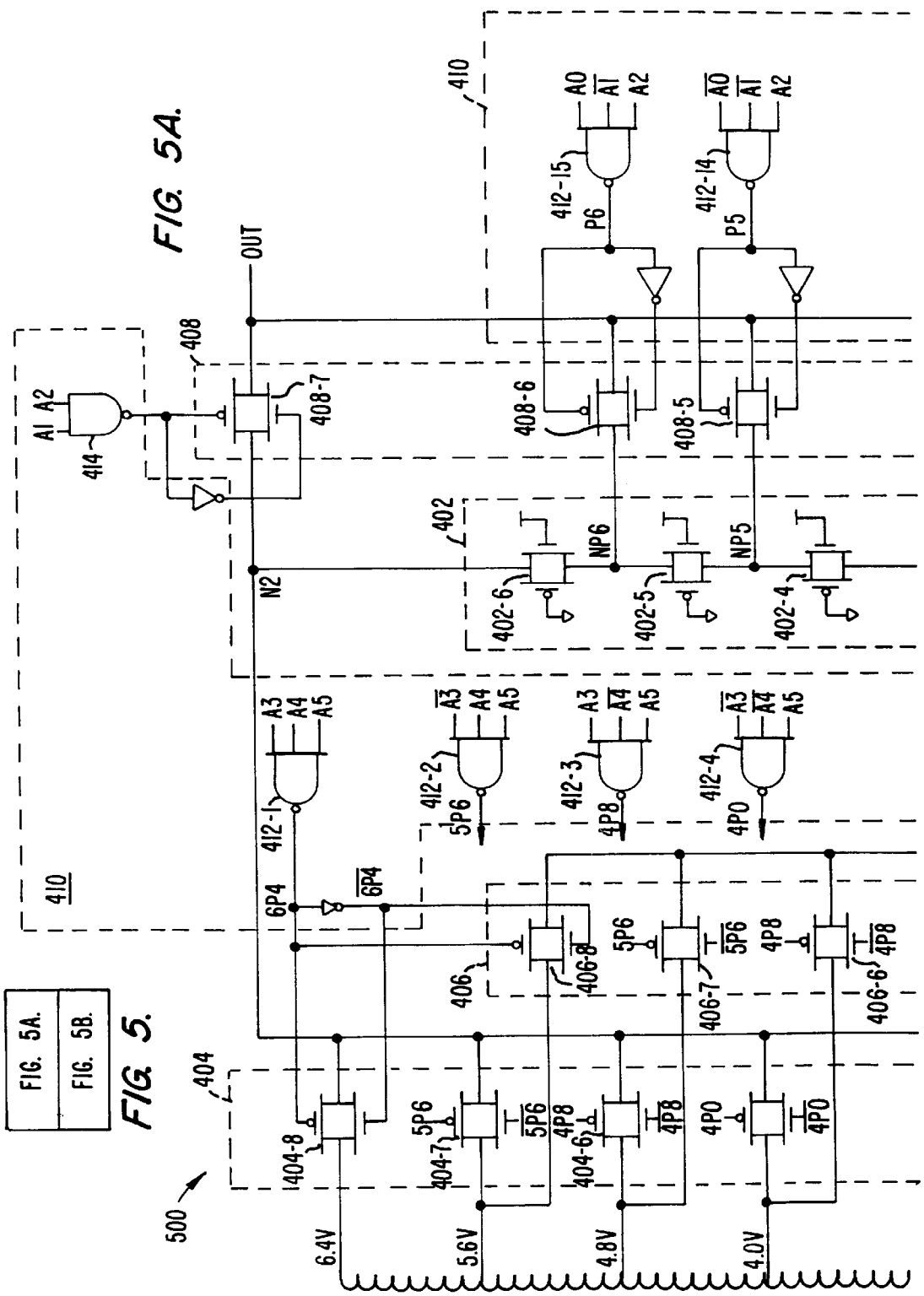

5,952,948

LOW POWER LIQUID-CRYSTAL DISPLAY DRIVER

BACKGROUND OF THE INVENTION

The present invention relates in general to integrated circuits, and in particular to an improved liquid-crystal display (LCD) column driver circuit that substantially reduces power consumption and size of the circuit.

A liquid-crystal display is made up of a liquid-crystal layer sandwiched between two layers of vertical and horizontal polarizers, and two layers of vertical and horizontal grid wires. An active matrix LCD panel has a built-in thin-film transistor at each (x,y) grid point. Each transistor is used to establish an analog voltage on its LCD grid point. An electrical capacitance at each grid point serves as a storage unit for the state of a cell and can hold the cell in that state until it is changed or refreshed by the transistor. That is, the cell capacitance storing the analog voltage enables a cell to remain on all the time and hence to be brighter than it would be if it had to be operated at a duty cycle below 100%. The crystals can also be dyed to provide color. The horizontal grid wires are sequentially driven by row driver circuits and connect to the control gates of all transistors in one row, enabling each cell in that row to be simultaneously updated with a new analog voltage (brightness). These analog voltages are supplied by a multitude of column drivers through the vertical grid wires.

Advantages of LCDs are low cost, low weight, small size and low power as compared to cathode ray tube (CRT) displays. These properties of LCDs allow them to be used in portable computers and miniature television sets with continuous-tone images. However, to generate grey tones (i.e., varying brightness) of the various colors, existing LCD driver circuits tend to consume a relatively large amount of power. This can be a major drawback in battery operated equipment such as portable computers.

Referring to FIG. 1, there is shown a block diagram of a typical LCD column driver circuit and an active matrix LCD. The LCD driver circuit receives digital image data serially at the serial input terminal 100. Each set of, for example, six (or more) serial bits of image data contain the brightness information for one color of one picture cell (or pixel) on the LCD panel. The data first undergoes a serial to parallel conversion. This is accomplished by feeding the data serially into a shift register 102, and once shift register 102 is filled, loading the data into a latch 104 in a parallel fashion. Each color of each pixel of data (e.g., six bits) is then applied to a digital to analog converter (DAC) 106. Assume for illustrative purposes that DAC 106 is a 6-bit DAC with an analog output voltage having 64 levels ranging from 0.1 volts to 6.4 volts with a 0.1 volt resolution. The analog output of each DAC 106 drives a column of pixels inside an active matrix LCD panel 108. Each pixel for each color includes a thin-film transistor 110 whose drain terminal connects to a column and gate terminal to a row of the display. The source terminal of transistor 110 connects to a storage capacitor 112 that stores the pixel value for the associated crystal. The storage capacitor may be the capacitance of the display itself.

A typical LCD panel may include for example 512 pixels across one row. For a color display, each pixel includes three display elements and transistors, one for red, one for green and one for blue. Thus, there may be a total of 1536 display elements per row in the display, each driven by its own DAC 106. The 1536 required DACs 106 may be divided into, for example, eight separate integrated circuit chips each having 192 DACs 106. Given the large number of DACs, the size and power consumption of each DAC 106 becomes critical.

FIGS. 2 and 3 show an example of a typical prior art implementation of a 6-bit DAC 106. A transformer 200 receives input voltages of, e.g., ±5 volts at the two inputs of its primary coil in an alternating fashion. The turns ratio of transformer 200 is designed such that 6.4 volts is equally divided into eight 0.8 volt increments provided at eight taps of the secondary coil. These coarse analog reference signals are supplied to the several multiple-DAC chips. Each multiple-DAC chip includes a global resistor divider chain 202 which includes eight equal value resistors (202$i$) connected between each pair of taps, for a total of 64 resistors 202$i$. Thus, the 0.8 volts between each pair of taps from the secondary coil is further divided into eight 0.1 volt intervals by resistor divider chain 202. The 64 fine analog reference voltage outputs from global resistor divider chain 202 are shared by the various DACs 106 on the chip (in the above example the chip includes 192 DACs 106). Each DAC 106 includes eight switch banks 204$i$ of eight switches each that select one of the 64 analog reference voltages to be connected to the output of the DAC. Switches in switch banks 204$i$ are controlled by decoders 206$i$ that respond to the digital pixel data.

As shown in FIG. 3, each switch bank 204$i$ is made up of eight switches 300. Each switch 300 is controlled by a six-input NAND gate 302 inside a decoder 206$i$. NAND gate 302 receives the six-bit pixel data from latch 104 (FIG. 1). Accordingly, the six-bit pixel data selects one of 64 discrete levels of analog voltages in 0.1 increments ranging from 0.1 to 6.4 volts to be supplied to the drain of the thin-film transistors in the active matrix LCD panel.

There are a number of drawbacks associated with the prior art circuit. First, according to this prior art implementation, each voltage output of global resistor divider chain 202 must be able to drive the large capacitive load associated with as many as 192 LCD columns. It is also possible that all bits driven by the DAC chip may be required to switch from, for example, 0.1 volts all the way to 6.0 volts at the same time. To accomplish this at an acceptable rate, the 6.0 volt tap on resistor divider 202-8 must exhibit very low impedance. This limits the maximum size of the resistors used in the global resistor divider chains 202. Employing relatively smaller resistance in the resistor dividers 202 results in larger current dissipation by each multiple-DAC chip. Given the large number of DACs 106 required in an LCD driver system, the total current dissipated by the resistor dividers can add up to a significant amount. There is waste associated with this design since all eight resistive dividers 202-1, 202-2, . . . 202-8 consume power even if only one, for example, the 6.0 volt tap in the 202-8 divider drives all DAC outputs. Further, the decoding scheme of the prior art requires a very large number gates (e.g., 64 6-input decoder gates) which adds to the circuit area.

There is therefore a need for an LCD column driver circuit that consumes less power and area.

SUMMARY OF THE INVENTION

The present invention provides a digital to analog converter (DAC) circuit that substantially reduces both power consumption and circuit area. The DAC of the present invention is particularly suitable for use in liquid-crystal display driver circuits. Broadly, the DAC includes circuitry that switches its own resistive divider chain between an appropriate adjacent pair of coarse analog reference signals and selects the appropriate divider chain node to generate the desired fine analog output signal. Based on the most significant bits of digital input, the DAC of the present invention selects an adjacent pair of coarse analog reference signals and switches its resistive divider between the selected pair. The least significant bits of the digital input then select the particular tap along the resistive divider to be switched to the DAC output.

Further, the highly efficient implementation of the DAC according to the present invention allows each DAC inside a multiple-DAC chip in an LCD driver system to have its own resistive voltage divider chain, preferably fabricated from small MOS transistors. This results in substantial power and area savings.

In one embodiment of the present invention, both the resistive divider and the switches in the DAC are made up of MOS transistors to improve tracking and accuracy of the DAC. In a preferred embodiment, the switches also acting as resistive elements combine with the resistive elements of the divider chain to form an overall voltage divider chain.

Accordingly, in one embodiment, the present invention provides a liquid-crystal driver circuit including a plurality of digital to analog converters, wherein each digital to analog converter has a dedicated resistive divider chain. Each digital to analog converter further includes a plurality of input taps receiving a corresponding plurality of analog reference signals, a resistive divider, a plurality of switches coupled to the resistive divider and the input taps, and a decoder receiving digital inputs and in response thereto controlling the plurality of switches to couple the resistive divider between a selected adjacent pair of input taps. In one embodiment, the resistive divider and the plurality of switches comprise MOS transistors. In a preferred embodiment, the MOS resistive divider includes the MOS switches.

In yet another embodiment, the present invention provides a digital to analog converter (DAC) including a resistive divider comprising MOS transistors, a plurality of switches coupled to the resistive divider and a decoder coupled to the plurality of switches. The resistive divider in the DAC according to a preferred embodiment includes a selected plurality of the switches.

A better understanding of the nature and advantages of the LCD driver and digital to analog converter of the present invention may be had with reference to the detailed description and drawings below.

DESCRIPTION OF SPECIFIC EMBODIMENTS

Figure 1:
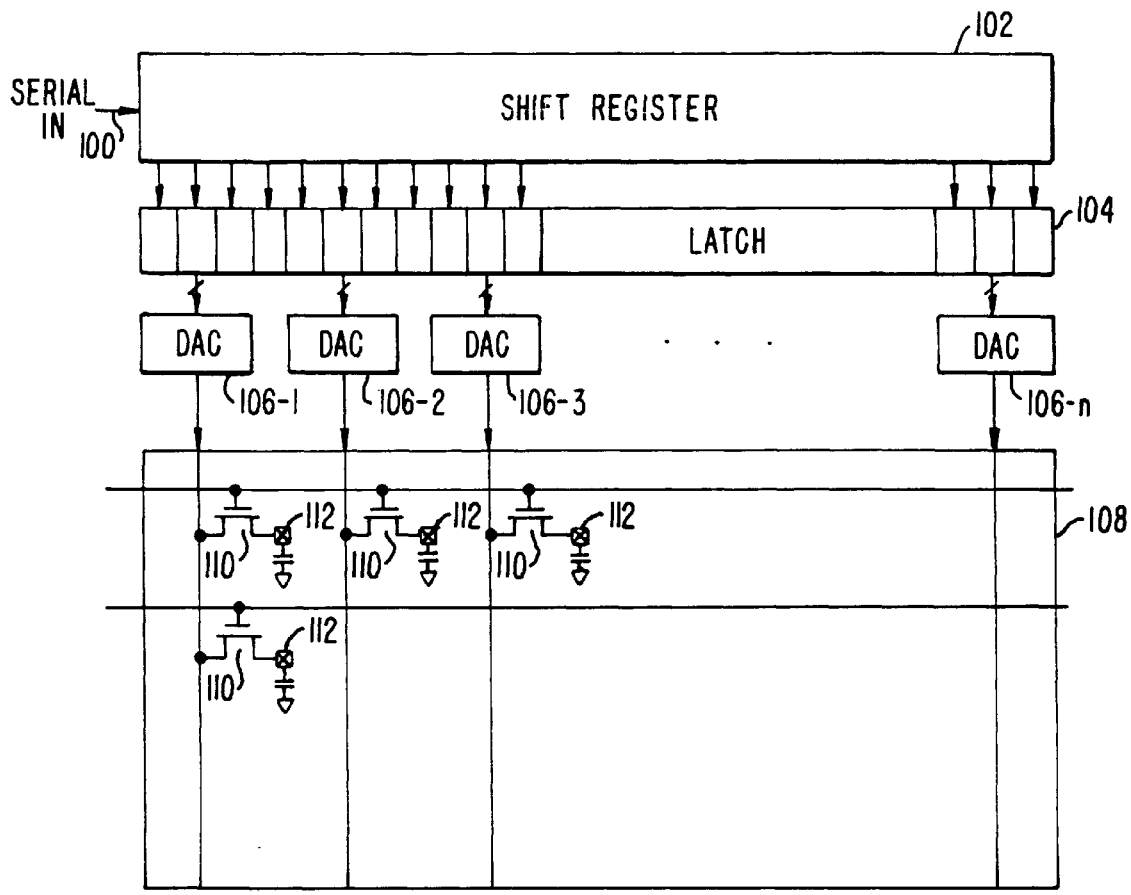
FIG. 1 is a block diagram of a typical column driver circuit for a liquid-crystal display.
Figure 2:
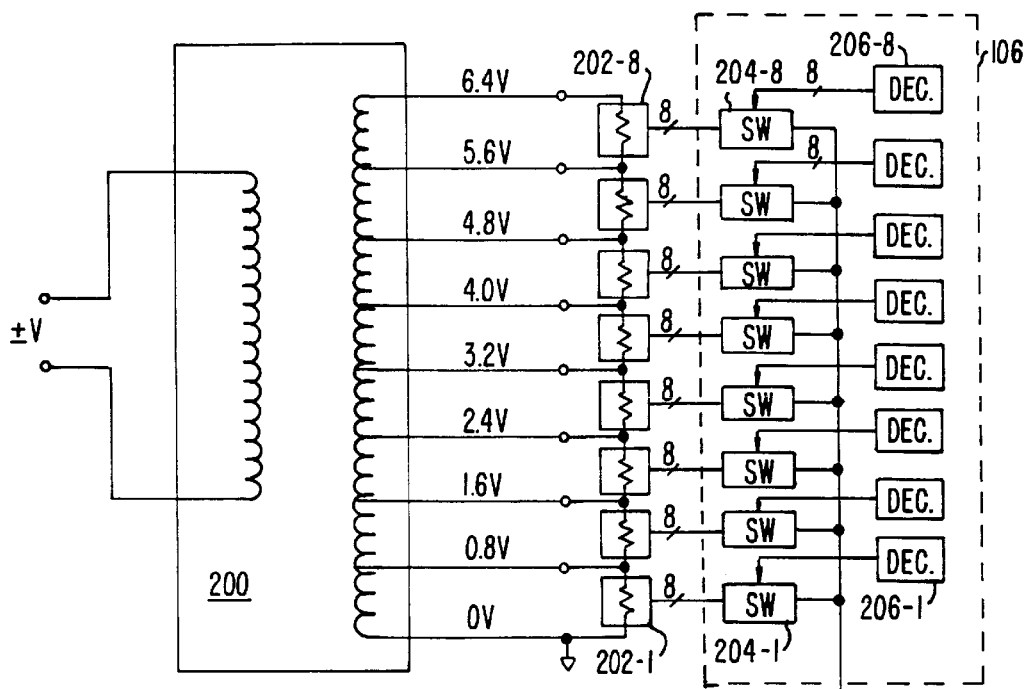
FIG. 2 is a typical prior art digital to analog converter (DAC) employed in LCD driver circuits.
Figure 4:
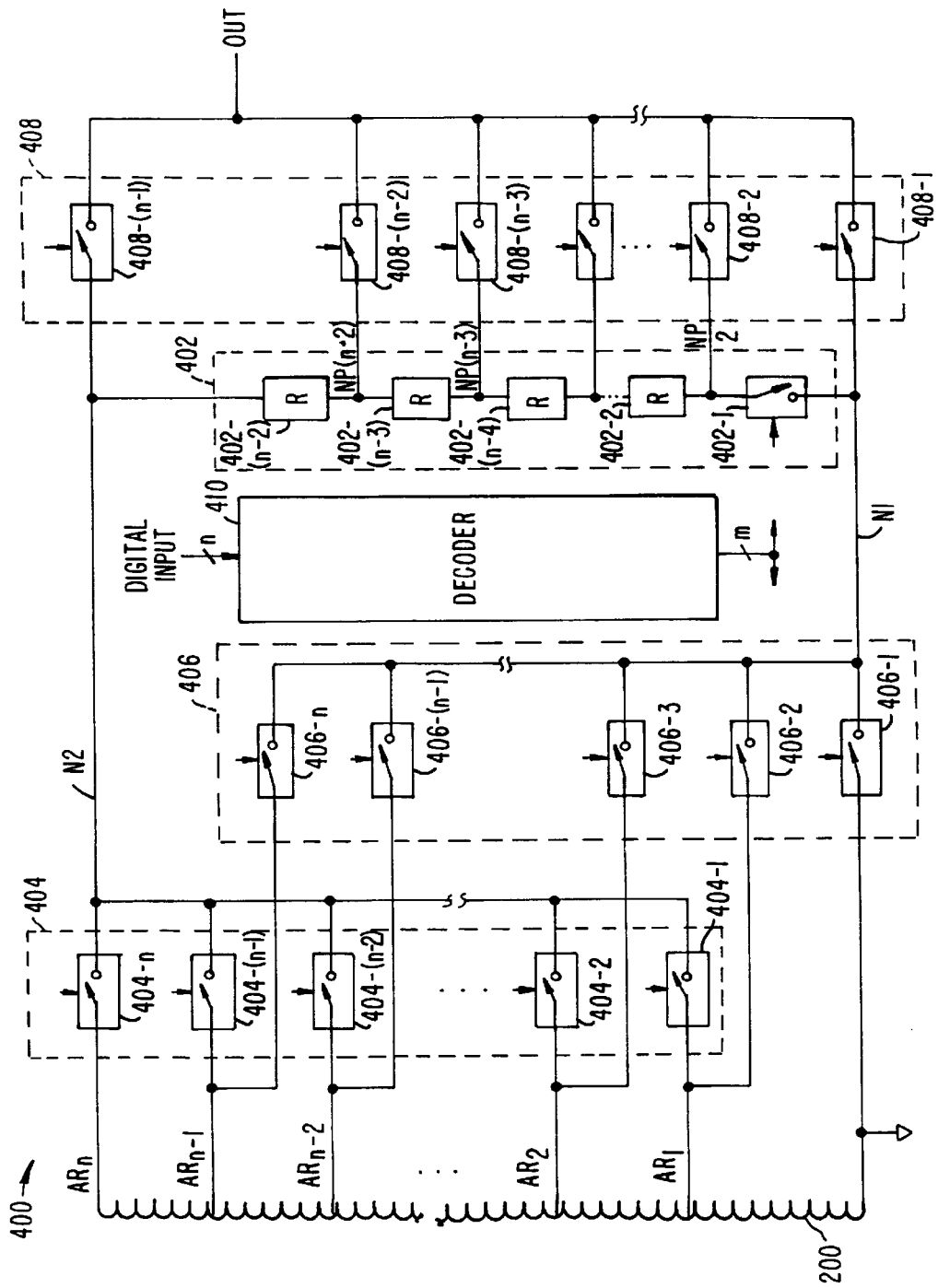
FIG. 4 is a simplified embodiment of a DAC for use in LCD driver circuits according to the present invention.

Referring to FIG. 4, there is shown a simplified embodiment of digital to analog converter (DAC) 400 for use in LCD driver circuits according to the present invention. As in the DAC configuration of FIG. 2, a transformer 200 supplies the analog reference signals AR1 to ARn on n taps. However, instead of using resistive divider chains (202 in FIG. 2) between each adjacent pair of taps to form a long resistive divider with many resistors, DAC 400 employs an innovative combination of switches and resistive elements that allows a single resistive divider 402 to be selectively switched between the various pairs of adjacent taps.

Resistive divider chain 402 according to the preferred embodiment of the present invention includes resistive elements 402-1, 402-2, . . . , 402-(n−2) serially connected between node N1 and node N2. A first bank of resistive switches 404 switchably connects node N2 to the various analog reference taps, and a second bank of resistive switches 406 switchably connects node N1 to the various analog reference taps. Thus, by selectively turning on a switch from first bank 404 and a switch from second bank 406, divider chain 402 connects between a selected adjacent pair of primary analog reference signal taps ground, AR1, AR2 to ARn.

The internal nodes NP2, . . . NP(n−2) and nodes N1 and N2 of divider chain 402 provide the finer (e.g., 0.1 volt increment) analog signals. These internal nodes N1, NP2, . . . , NP(n−2), and N2 switchably connect to the output node OUT via a third bank of switches 408. As will be discussed in greater detail below, switches 404 and 406 in DAC 400 according to the present invention also act as resistive elements that form part of the overall voltage divider chain. All switches in the various switch banks are controlled by outputs of a decoder 410. Decoder 410 receives the digital input data to the DAC, decodes the data and controls the switches accordingly to produce the desired analog signal at the output terminal OUT.

Figure 5B:
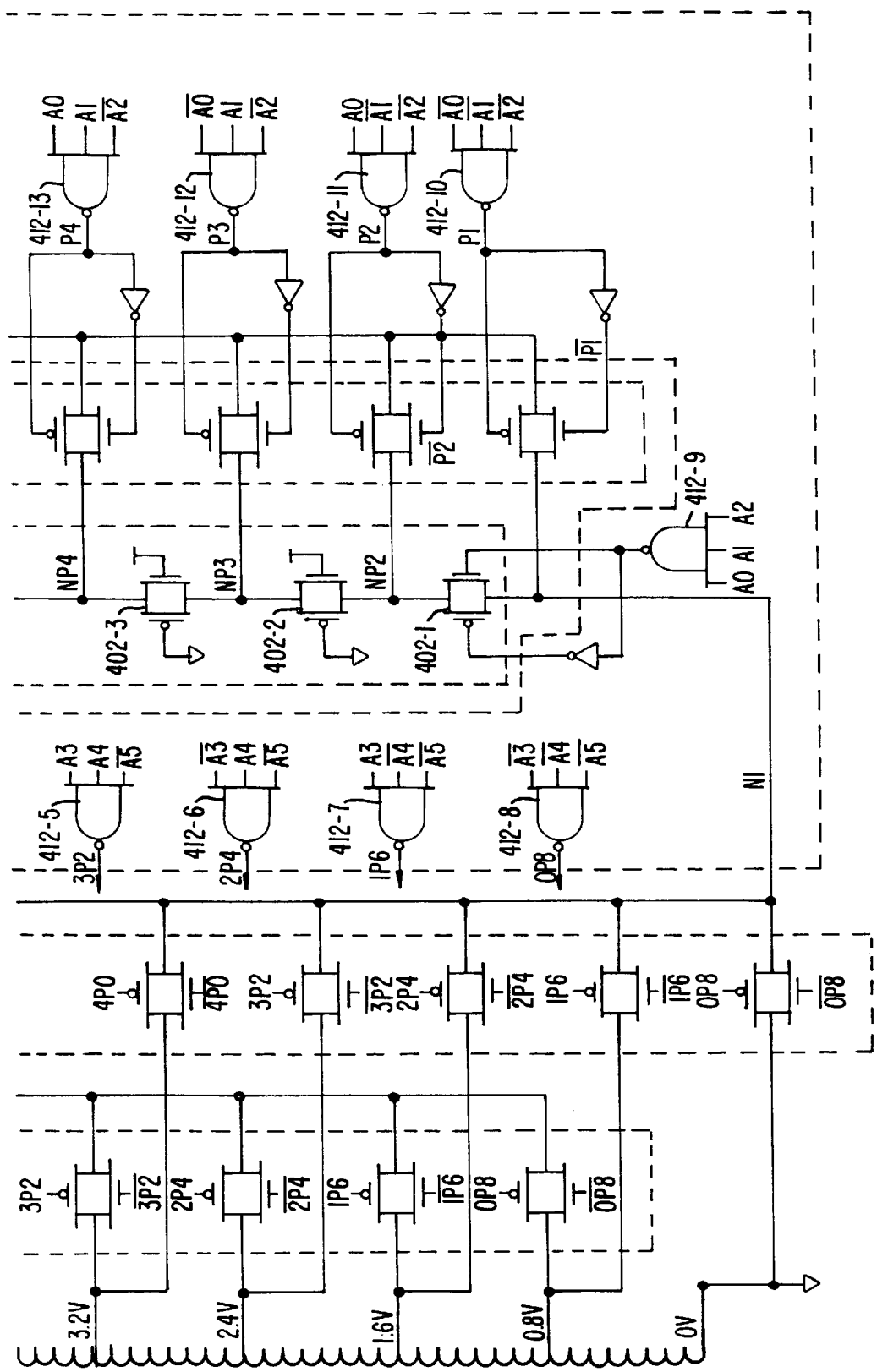
FIG. 5 is an exemplary implementation of a 6-bit DAC according to a preferred embodiment of the present invention.

The operation of the circuit of the present invention will be described in greater detail hereinafter in connection with an exemplary embodiment shown in FIG. 5. Referring to FIG. 5, there is shown an exemplary 6-bit DAC 500 implemented according to a preferred embodiment of the present invention. The same reference numerals are used to identify the same circuit blocks in both FIGS. 4 and 5. In the exemplary circuit implementation shown in FIG. 5, DAC 500 is a 6-bit DAC converting a 6-bit digital data (A0, A1, A2, A3, A4, and A5) to one of 64 analog voltage levels ranging from 0.1 volts to 6.4 volts in 0.1 volt increments. It is to be understood that these specific numbers are used herein for illustrative purposes only, and that a DAC of any size can benefit from the technique of the present invention.

To improve the accuracy of the DAC, the present invention preferably employs CMOS transmission gates to implement both the switches in the various switch banks and the resistive elements in divider chain 402. Thus, each one of the switches 404$i$, 406$i$ and 408$i$ is made up of an NMOS and PMOS pair of transistors connected to form a transmission gate as shown. The gate terminals of the NMOS and PMOS transistors in each switch receive complementary signals supplied by decoder 410. Similarly, each resistive element 402-i in resistive divider chain 402 is made up of an NMOS and PMOS pair of transistors connected to form a CMOS transmission gate. Of the six transmission gates 402, five (402-2 to 402-6) are always ON, and one (402-1) is made switchable. Thus, the gate terminals of NMOS and PMOS transistors in each transmission gate 402-2 to 402-6 connect to a positive voltage (e.g., power supply Vcc of about 6.4 volts) and ground, respectively. Switchable transmission gate 402-1 provides for a selective disconnect along divider chain 402.

In the exemplary embodiment of FIG. 5, decoder 410 includes 15 three-input NAND gates 412 and one two-input NAND gate 414 that receive at their inputs various combinations of the true and complement of the 6-bit digital input data. The outputs of the various NAND gates control the switches as shown.

The sizes of switches 408 are chosen to minimize their on-resistance to reduce the time constant in driving the output. The sizes of NMOS transistors in switches 404, 406 and 402-1 are equal to each other and to that of NMOS transistors in transmission gates 402-2 through 402-6. Similarly, the PMOS transistors in all of these elements are equal in size. The value of the resistance for the resistive elements participating in the voltage dividing function is a compromise between speed and power.

Figure 6A:
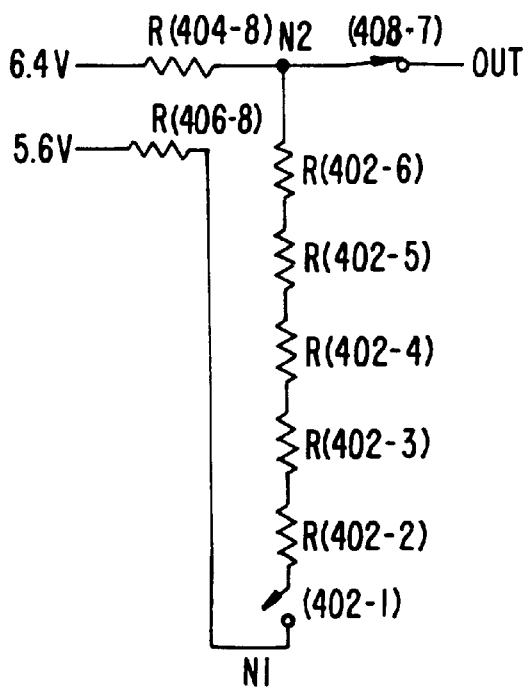
FIGS. 6A, 6B, and 6C show simplified equivalent resistive divider circuits resulting from the circuit of FIG. 5 in response to exemplary digital input data.

As mentioned above, it is a feature of the present invention to have CMOS transmission gates perform both switching and resistive voltage dividing. The combined switching and resistive function will become apparent by describing several specific examples of conversion. In the first example, assume DAC 500 receives the data 111111 at its six inputs A5, A4, A3, A2, A1, and A0. This digital input corresponds to the analog value of 6.4 volts. With A3, A4, and A5 all receiving a logic "1" signal, NAND 412-1 turns on transmission gates 404-8 and 406-8, connecting nodes N2 and N1 to analog reference signals 6.4 volts and 5.6 volts, respectively. Transmission gate 408-7 is also turned on by NAND gate 414 which receives A1="1" and A2="1" at its inputs. Transmission gate 402-1, however, is turned off by NAND gate 412-9, breaking the resistive path between nodes N1 and N2. The resulting resistive divider chain is shown in FIG. 6A in a simplified fashion. Because transmission gate 402-1 is turned off, divider chain 402 does not draw any current, and the analog signal 6.4 volts is directly supplied to output terminal OUT.

Figure 6B:
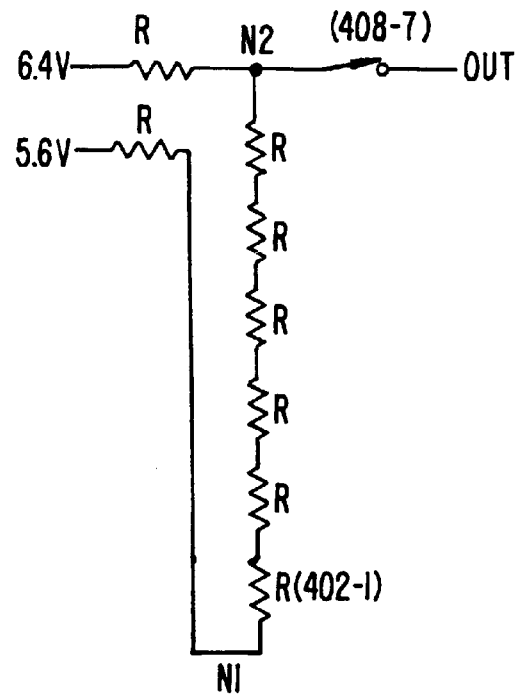

Next, consider as input the digital data 111110 corresponding to analog signal 6.3 volts. NAND gate 412-1 still turns on transmission gates 404-8 and 406-8, and NAND gate 414 turns on transmission gate 408-7. This time, however, NAND gate 412-9 turns on switch 402-1 creating a current path between nodes N1 and N2. The resulting equivalent resistive divider chain is shown in the simplified diagram of FIG. 6B. As shown in FIG. 6B, in response to a digital input data of 111110, eight conducting transmission gates (including switches 404-8 and 406-8) each having an on-resistance of R connect between 6.4 volts and 5.6 volts. The signal 6.4 volts minus one eighth of 0.8 (6.4–5.6) volts, or 6.4–0.1=6.3 volts appears at node N2, and thus at output terminal OUT. Note that the output in this case as well as in the previous example (input of 111111) is made available at node N2. However, in the case of 111111, N2 is at tap voltage 6.4 volts, while in the case of 111110, N2 is at 6.4–0.1=6.3 volts.

Figure 6C:
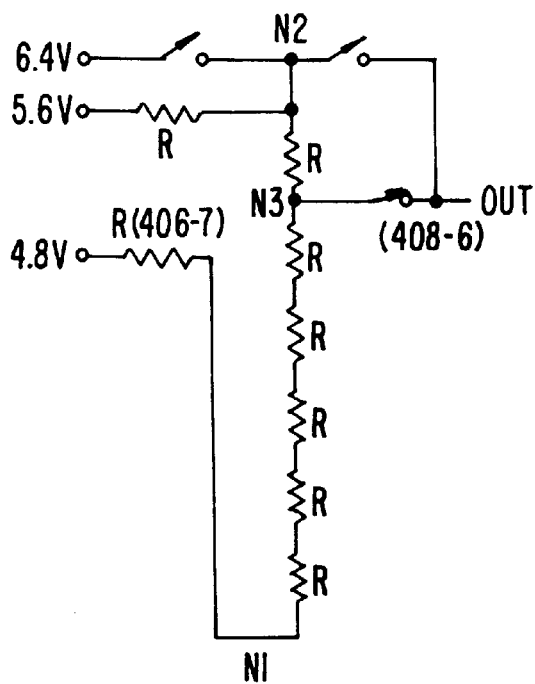

Finally, consider as input the digital data 110101 corresponding to analog signal 5.4 volts. With A5="1", A4="1" and A3="0", NAND gate 412-2 turns on resistive transmission gates 404-7 and 406-7, connecting nodes N2 and N1 to 5.6 volts and 4.8 volts reference signals, respectively. With A0="1", A1="0" and A2="1", NAND gate 414 turns off transmission gate 408-7, NAND gate 412-9 turns on transmission gate 402-1, and NAND gate 412-15 turns on transmission gate 408-6. The resulting equivalent resistive divider chain is shown in FIG. 6C in a simplified fashion. Accordingly, the voltage at node N3 (which corresponds to node NP6 of FIG. 5), and therefore at output terminal OUT), is equal to 5.6 volts minus 2×[(5.6–4.8)/8]=0.2 volts, or 5.4 volts.

Among the various advantages of the DAC implementation according to the present invention, reduction in power consumption is quite significant. Unlike the prior art implementations where resistive dividers between each pair of reference signals dissipate current regardless of the digital input data, in the DAC of the present invention current is dissipated by a single resistive divider between a pair of adjacent analog reference signals only. Since each DAC of the present invention drives a single output, each resistive element in the divider chain of the exemplary embodiment shown in FIG. 5 can have a resistance that is 192 times as high as the resistive elements of the prior art DAC shown in FIG. 2. In the exemplary system described herein, the technique of the present invention thus results in an eight times reduction in power consumption since each active resistive divider is between taps that are 0.8 volts apart instead of taps that are 6.4 volts apart.

Figure 3:
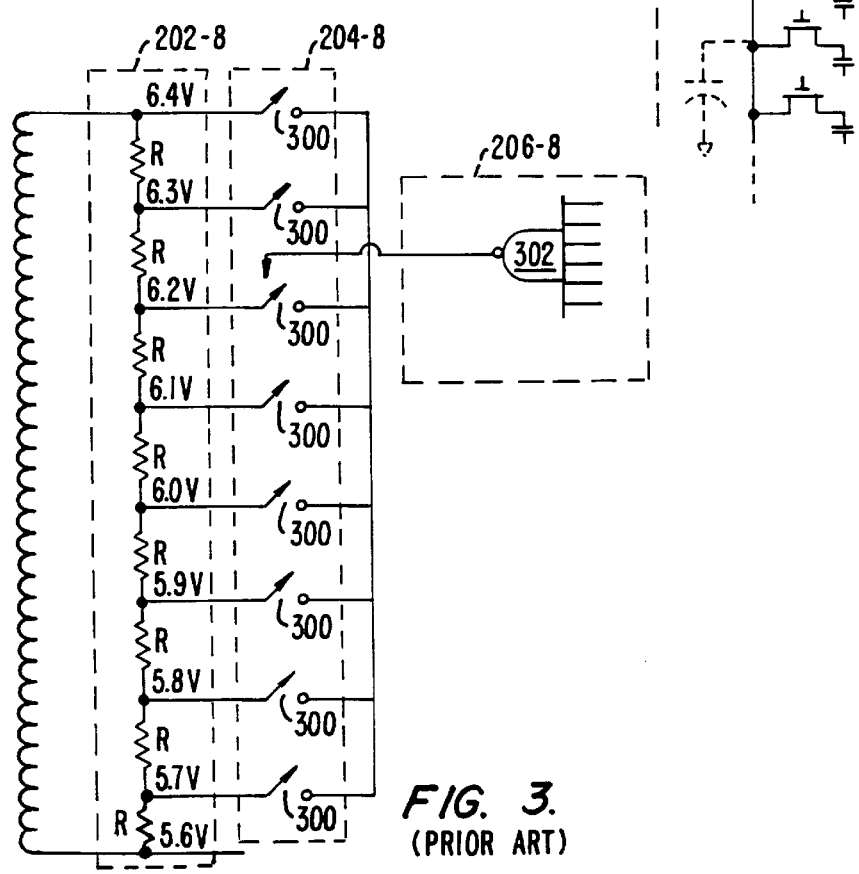
FIG. 3 is a typical prior art resistor divider chain for use in the DAC of FIG. 2.

Further, the DAC of the present invention, when utilized in an LCD driver system eliminates the global resistive voltage divider chain whose outputs are shared by, for example, 192 DACs in a multiple-DAC chip. DAC 400 as shown in FIG. 4 provides the finer (0.1 volt) analog reference signals between every pair of coarse analog reference signals, using minimal circuitry. This circuit can thus be repeated for each output (i.e., each column of the LCD panel) while substantially reducing the circuit area. The prior art example shown in FIGS. 2 and 3 requires a 6-input NAND gate (12 transistors), an inverter (2 transistors), and a transmission gate (2 transistors) for each of 64 analog levels. This adds up to a significant 16×64=1024 transistors per DAC in the prior art implementation. This compares to only 184 transistors in the each DAC of the exemplary embodiment of the present invention as depicted in FIG. 5.

A further advantage of the present invention is the inherent accuracy resulting from the use of CMOS transmission gates to implement both resistive elements and switches whose resistances track over temperature and process variations. The CMOS transmission gates operates such that at all times either both transistors (NMOS and PMOS) are conductive or both are non-conductive. The PMOS transistor is designed to have a greater width to length ratio than the NMOS transistor to compensate for the inherent higher gain of the NMOS transistor. That is, both are designed to have about the same transconductance. When each transmission gate operates at low (source and drain) voltage, the NMOS transistor is low resistance and the PMOS transistor is high resistance or off. At high analog voltages, the NMOS transistor is high resistance or off, while the PMOS transistor is low resistance. At intermediate voltages, both transistors have intermediate resistances. Thus, the pair of transistors, NMOS and PMOS in parallel, provides reasonably equal resistances as source and drain voltages vary. The voltage error due to the variation of resistance with voltage is very much below 0.1 volt (the resolution of the 6-bit DAC), and thus negligible.

In conclusion the present invention provides a digital to analog converter (DAC) circuit that substantially reduces both area (and thus cost) and power consumption. The DAC of the present invention is particularly suitable for use in LCD driver systems that require large numbers of DACs. The DAC includes circuitry that switches a single resistive divider between a selected adjacent pair of coarse analog reference signals to generate the desired fine analog output signal. By thus only connecting a single resistive divider between a selected adjacent pair of coarse analog reference signals, the present invention substantially reduces power consumption and circuit size. Further, both the resistive divider and the switches in the DAC according to the preferred embodiment of the present invention are made up of MOS transistors to improve tracking and accuracy of the DAC. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A converter circuit having an output, comprising:

a plurality of input taps coupled to receive a corresponding plurality of analog reference signals;

a first switch bank comprising a first plurality of transistors having respective input terminals coupled to the plurality of input taps and respective output terminals coupled to a first node N1;

a second switch bank comprising a second plurality of transistors having respective input terminals coupled to the plurality of input taps and respective output terminals coupled to a second node N2;

a resistive divider chain comprising a plurality of resistive elements coupled between the first and second nodes N1 and N2, the resistive divider chain having internal nodes;

a third switch bank comprising a fourth plurality of transistors having respective input terminals coupled to the internal nodes of the resistive divider chain and respective output terminals; and a decoder receiving digital inputs and in response thereto controlling the first and second switch banks to couple the resistive divider chain between a selected pair of adjacent input taps, wherein, each switch in said first switch bank and each resistive element in said resistive divider chain is made up of identically configured transistors.

2. The converter circuit of claim 1 wherein said resistive divider chain comprises MOS transistors coupled in series.

3. The converter circuit of claim 2 wherein said resistive divider chain comprises serially coupled CMOS transmission gates.

4. The converter circuit of claim 1 wherein one of said MOS transistors in said resistive divider chain is made switchable to create an open circuit when turned off.

5. The converter circuit of claim 1 wherein said first plurality of transistors comprise a plurality of MOS transistors.

6. The converter circuit of claim 1 wherein said first plurality of transistors comprise CMOS transmission gates.

7. The converter circuit of claim 1 wherein resistance of said first plurality of transistors in combination with said resistive divider chain form a resistive voltage divider.

8. The converter circuit of claim 7 wherein the resistance of each of said first plurality of transistors is substantially equal to a resistance of each resistive element in said resistive divider chain.

9. The converter circuit of claim 1, wherein each switch in said second switch bank is also made up of indentically configured transistors.

10. The converter circuit of claim 9, wherein each switch in said third switch bank is also made up of identically configured transistors.

11. The converter circuit of claim 10, wherein each switch in said first, second, and third switch banks, and each resistive element in said resistive divider chain consists of a CMOS transmission gate made up of parallel-coupled NMOS and PMOS transistor pair, wherein all NMOS transistor are substantially the same size, and wherein all of PMOS transistors are substantially the same size.

12. The converter circuit of claim 11 wherein except for one resistive element that is a switchable CMOS transmission gate, each of the remaining ones of said serially-coupled resistive elements is a constantly turned on CMOS transmission gate made up of a PMOS transistor having a gate terminal coupled to a low potential and an NMOS transistor having a gate terminal coupled to a high potential.

13. A liquid-crystal display (LCD) driver comprising a plurality of digital to analog converters each digital to analog converter comprising:

a plurality of input taps coupled to receive a corresponding plurality of analog reference signals;

a first switch bank comprising a first plurality of transistors having respective input terminals coupled to the plurality of input taps and respective output terminals coupled to a first node N1;

a second switch bank comprising a second plurality of transistors having respective input terminals coupled to the plurality of input taps and respective output terminals coupled to a second node N2;

a resistive divider chain comprising a plurality of resistive elements coupled between the first and second nodes N1 and N2, the resistive divider chain having internal nodes;

a third switch bank comprising a fourth plurality of transistors having respective input terminals coupled to the internal nodes of the resistive divider chain and respective output terminals; and a decoder receiving digital inputs and in response thereto controlling the first and second switch banks to couple the resistive divider chain between a selected pair of adjacent input taps, wherein each switch in said first switch bank and each resistive element in said resistive divider chain is made up of identically configured transistors.

14. The LCD driver of claim 13 wherein each digital to analog converter output drives a column of the LCD panel.

15. A method of converting a digital signal to an analog signal comprising the steps of:

generating a plurality of coarse analog reference signals on a plurality of reference taps;

switchably coupling said plurality of reference taps to a first node and a second node using a first plurality of CMOS transmission gates;

providing a signal divider chain comprising a second plurality of CMOS transmission gates serially-coupled between said first and second node, said second plurality of CMOS transmission gates being constantly turned on; and selectively switching the signal divider chain between adjacent pairs of the plurality of reference taps in response to the digital signal, to generate a plurality of fine analog reference signals.

16. The method of claim 15 further comprising a step of selectively switching one of the plurality of coarse or fine analog reference signals to an output.

17. The method of claim 16 wherein said step of selectively switching one of the plurality of coarse or fine analog reference signals to an output, further comprises a step of disconnecting a current path in said signal divider chain when switching one of the plurality of coarse analog reference signals to the output.

18. The method of claim 16 wherein said signal divider chain is a resistive voltage divider, and wherein said switching step is preformed using a plurality of switches, said method further comprising a step of combining resistance of said plurality of switches with said resistive voltage divider to generate said plurality of fine analog reference signals.

19. A method of converting digital signal to analog signal, comprising the steps of:

generating a plurality of analog reference signals by a resistive voltage divider chain; and selecting one of the plurality of analog reference signals for output using a select circuitry, wherein, said step of generating comprises a step of combining resistance of the select circuitry with the resistive voltage divider chain to generate the plurality of analog reference signals.

20. The method of claim 19 further comprising the steps of:

providing a plurality of coarse analog reference signals on a plurality of taps; and selectively switching the resistive voltage divider chain between an adjacent pair of taps.

21. A digital to analog converter circuit comprising:

a plurality of input taps coupled to receive a corresponding plurlaity of analog reference signals;

a first switch bank comprising a first plurality of CMOS transmission gates having respective input terminals coupled to the plurality of input taps and respective output terminals coupled to a first node N1;

a second switch bank comprising a second plurality of CMOS transmission gates having respective input terminals coupled to the plurality of input taps and respective output terminals coupled to a second node N2;

a resistive divider chain comprising a plurality of serially-coupled resistive elements coupled between the first and second nodes N1 and N2, the resistive divider chain having internal nodes;

a third switch bank comprising a fourth plurality of CMOS transmission gates having respective input terminals coupled to the internal nodes of the resistive divider chain and respective output terminals; and a decoder receiving digital inputs and in response thereto controlling the first and second switch banks to couple the resistive divider chain between a selected pair of adjacent input taps, wherein, except for one resistive element that is a switchable CMOS transmission gate, each of the remaining ones of said serially-coupled resistive elements is a constantly turned on CMOS transmission gate made up of a PMOS transistor having a gate terminal coupled to a low potential and an NMOS transistor having a gate terminal coupled to a high potential.

* * * * *